United States Patent [19]

Taylor et al.

[11] Patent Number: 4,823,324
[45] Date of Patent: Apr. 18, 1989

[54] PAGE MODE OPERATION OF MAIN SYSTEM MEMORY IN A MEDIUM SCALE COMPUTER

[75] Inventors: Billy K. Taylor; Larry C. James, both of West Columbia, S.C.

[73] Assignee: NCR Corporation, Dayton, Ohio

[21] Appl. No.: 778,815

[22] Filed: Sep. 23, 1985

[51] Int. Cl.[4] ............................................. G11C 8/00
[52] U.S. Cl. ................................. 365/230; 365/193; 365/194
[58] Field of Search ............... 365/238, 189, 230, 193, 365/194

[56] References Cited

U.S. PATENT DOCUMENTS

| | | | |
|---|---|---|---|
| 4,486,860 | 12/1984 | Takemae et al. | 365/189 |
| 4,541,090 | 9/1985 | Shiragasawa | 365/201 |
| 4,575,825 | 3/1986 | Ozaki et al. | 365/193 |
| 4,694,454 | 9/1987 | Matsuura | 365/222 |

FOREIGN PATENT DOCUMENTS

2093236 8/1982 United Kingdom .
80/00632 4/1980 World Int. Prop. O. .

Primary Examiner—James W. Moffitt
Attorney, Agent, or Firm—Wilbert Hawk, Jr.; Edward Dugas; Gregory P. Gadson

[57] ABSTRACT

A memory device is disclosed which is comprised of a plurality of memory boards each having at least one memory bank associated therewith with each memory bank including a plurality of memory elements addressable by rows and columns. In page-mode operation of the memory device, all of the memory elements receive the active row address strobe signal RAS. The RAS signal is maintained active as long as the memory is to remain in page-mode operation. Memory address information is decoded to select a memory board and a memory bank from the plurality of memory boards and to enable the memory elements to permit either a read or a write operation without the need for performing additional address strobe cycles.

7 Claims, 7 Drawing Sheets

PAGE MODE OPERATION OF MAIN SYSTEM MEMORY IN A MEDIUM SCALE COMPUTER

BACKGROUND OF THE INVENTION

The present invention relates to a memory circuit, and more particularly to a semiconductor memory circuit employing DRAM's and operable in page-mode.

Generally, for performance reasons, system memories are implemented using dynamic random access memories, DRAM's, since they afford high densities (up to 262,144 bits per chip), good performance, and they are reasonably priced compared to alternate technologies. These memories may be operated in page-mode. For purposes of this application a "page" refers to all of the storage cells (bits) of a given row of a DRAM. Most advantageously, page-mode operation is used in applications where memory locations are always accessed sequentially. In computer main memories, accesses are not always sequential, but tend to be sequential to a degree which provides a significant performance advantage. Generally, to operate a DRAM in non-page mode, the row address strobe signal RAS and the column address strobe CAS are activated for each memory access. Recent improvements in memory accessing have been achieved with the recognition that the signal RAS may be held active during a page-mode access and the signal CAS toggled with the next column address being applied to the address bus. As long as addressing is directed to the same page (or row) the RAS signal may be held active and accessing can be accomplished using the CAS signal to column address the memory.

In a specification manual entitled, 1984 Memory Data Book by FUJITSU pgs. 1-7, 1-8, and 1-10, there is provided a description of the page-mode operation of MB8117-10/MB8117-12 memory devices. The page-mode operation is described as permitting the strobing of the column address into the MB8117 while maintaining the signal RAS at a logic "low" level throughout all successive memory operations in which the row address doesn't change.

In an INTEL application note AP-170 entitled, "Intel® 51C64 and 51C65 CHMOS-D III 65K Dynamic RAM Device Descriptions" (pgs. 16-18), there is described a Ripplemode ™ operation wherein the cycle executes by maintaining RAS low while successive CAS cycles are performed. The column address buffer acts as a flow through latch while CAS is high. The data access begins from the time valid column addresses appear on the address bus, rather than from the time CAS occurs.

A patent of interest for its teaching is; U.S. Pat. No. 4,429,375 entitled "Consecutive Addressing of a Semiconductor Memory" by S. Kobayashi, wherein a system is described that uses a shift register to take in column address information at the time the memory cell is accessed. Thereafter in a "consecutive access mode", controlled only by the CAS clock, memory cells having consecutive addresses along the row direction, starting with the address taken in during the preceding RAS/CAS cycle, are accessed, bit-by-bit, by the shift register with each CAS clock signal bumping the column address stored therein without waiting for the column address information to be available through a column address buffer.

Another patent of interest for its teaching of column addressing is; U.S. Pat. No. 4,485,461 entitled "Memory Circuit" by S. Kobayashi. Within that patent there is taught the technique of performing consecutive write operations by entering the "consecutive access mode" which is controlled only by the CAS signal while holding the RAS signal in the active level. Memory cells having consecutive addresses along the row direction will thereby be addressed in turn and data written into the memory cells. This patent is the sequel to the aforementioned patent #375 wherein the page-mode read operation is disclosed. The gist of the two aforereferenced patents is that the generation of the column address information, upon every activation of the CAS signal, as in the case of prior art page-mode systems, is not necessary. On the basis of the column address information taken in at the cycle just prior to the institution of the consecutive address mode, a shift register starts the transfer of the decoded information for each bit, and the decoders will be consecutively selected, thus the time required for the latching operation of the column address information by means of a column address buffer, and the time for the operation of the decoders by means of the sequentially amplified and produced address binary codes, is omitted.

SUMMARY OF THE INVENTION

In a preferred embodiment of the invention a memory device is provided with a plurality of memory boards each having banks of memory arrays associated therewith with each of the memory arrays including a plurality of memory elements arranged in rows and columns. Each board contains a means for applying an active row strobe signal to the memory elements of each of the plurality of memory arrays and a means for applying row address information to the memory cells of each of the plurality of memory arrays in response to the row strobe signal. A memory board selection means responsive to a memory address signal provides an enabling signal to a selected memory board and a bank selection means responsive to a memory address signal provides a column strobe signal to each memory element of a selected bank of memory arrays on a selected board, so as to enable the selected memory elements to receive column address information. In page-mode operation, maintaining the row strobe signal active and the row address information constant will permit the memory to be column addressed at a selected board and a selected bank without the need for performing additional row address strobe cycles.

It is an object of the present invention to provide an improved page-mode accessing system.

It is another object of the present invention to provide a multiple board memory having a common RAS signal access with the memory address signal being decoded to select the memory banks on each board.

It is another object of the present invention to provide a fast page-mode addressing system.

It is a further object of the present invention to increase the size of the memory page by interconnecting multiple memories which are addressed as a single memory.

The aforementioned objects of the present invention will become more apparent when taken in conjunction with the following description and drawings, wherein like characters indicate like parts and which drawings form a part of this application.

DESCRIPTION OF THE PREFERRED EMBODIMENT

Figure 1:
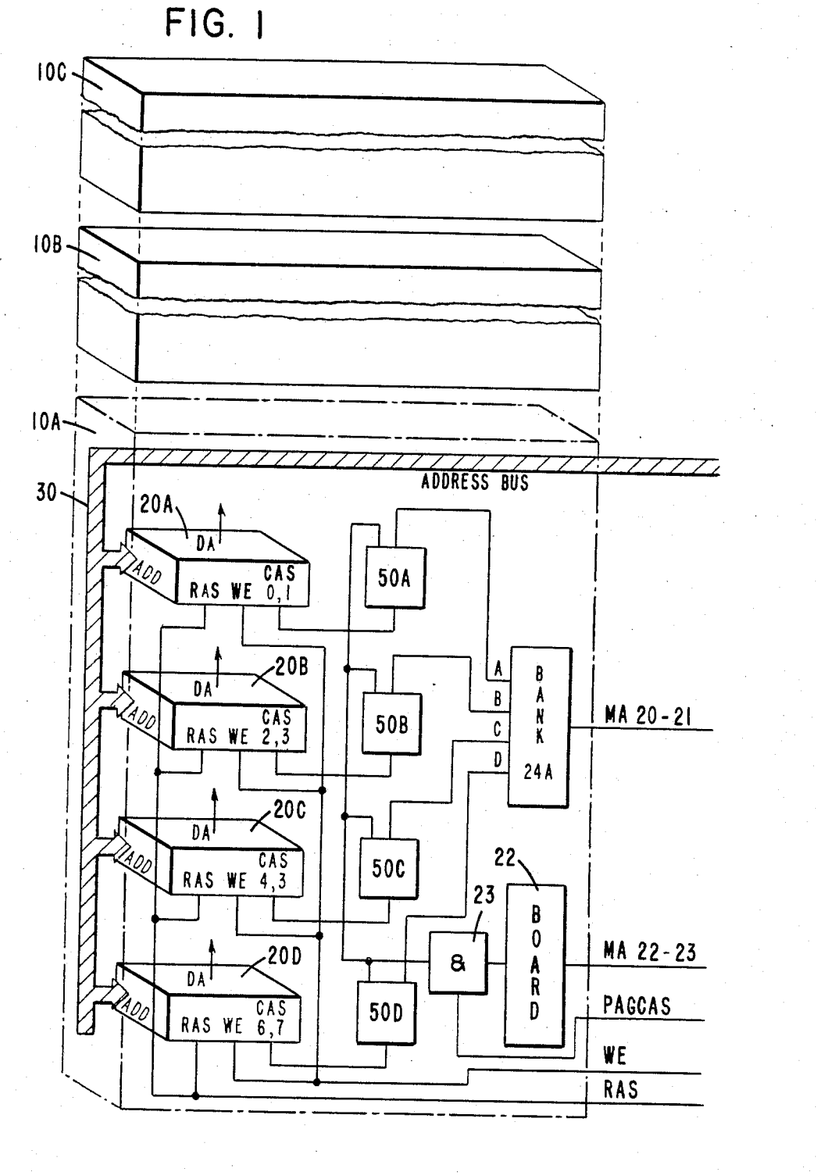
FIG. 1 is a block schematic diagram illustrating the preferred arrangement of the memory elements according to the present invention.

Referring to FIG. 1, in the arrangement of the present invention there is provided three major memory array boards 10A, 10B and 10C. Additional boards may be added without detracting from the present inventive contributions. On each of the boards there is affixed four banks of memory elements, 20A-20D with each bank being 32 bits deep, which is the equivalent of repeating each of the memory elements 20A-20D 32 additional times into the depth of the drawing. If parity checking is to be used additional memory elements will be required. Each bank is identical in construction and is individually addressable. A bank section logic circuit 24A receives as inputs the binary bank selection signals, MA20-21, and decodes the signals to provide at one of its four outputs labeled A, B, C or D, an enabling signal which signal is directed to an associated AND gate 50A-50D. Each of the AND gates 50A-50D has its output connected to the column address strobe inputs, labeled CAS, of an associated memory element 20A-20D. A board decode logic 22 receives on its input the binary board selection signals denoted MA22-23 corresponding to memory address bits. Each board's decoding logic 22 is configured to respond to its own unique code. When the address bits MA22-23 are recognized by a board's decoding logic the decoding logic provides an output signal which is used to enable the board. Only one board is enabled at any time. The output signal from board decode logic 22 is directed, as one of two enabling inputs, to an input of each of the AND gates 50A-50D. If it is desired to select between more than four boards additional memory address bits will have to be allocated to provide adequate bit code combinations. Once a board is selected the AND gate, receiving the enabling signal from the bank selection logic 24A will, on its output, provide a high level signal to the CAS input of each of the memory elements in the selected bank. Each of the memory elements 20 has an input labeled RAS. In the preferred embodiment of the invention all of the RAS inputs on a board are connected thru common circuitry such that the application of an active signal on a board's RAS terminal will activate all of the memory elements on that board. The memory element's address terminals labeled ADD are interconnected to a 9-bit address bus 30. With the signal RAS active, the column address strobe signal CAS is activated and row and column address data is directed to each of the memory elements over the address bus 30. When in page mode operation the row address remains the same and the column address can be changed to effectively read out data within that column at a faster rate.

Each memory element also has a write enable input labeled WE. In the preferred embodiment of the invention all of the WE inputs on a board are connected thru common circuitry to permit a write operation to be performed in page-mode.

Figure 2:
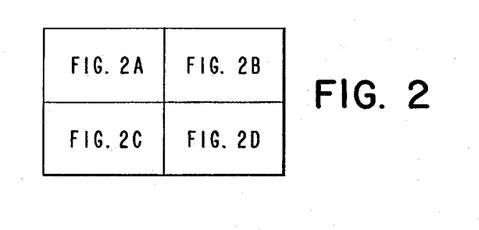
FIG. 2 is a map illustrating the relationship of FIGS. 2A-2D which form a schematic diagram illustrating logic circuitry for controlling the memory elements of FIG 1.
Figure 2A:
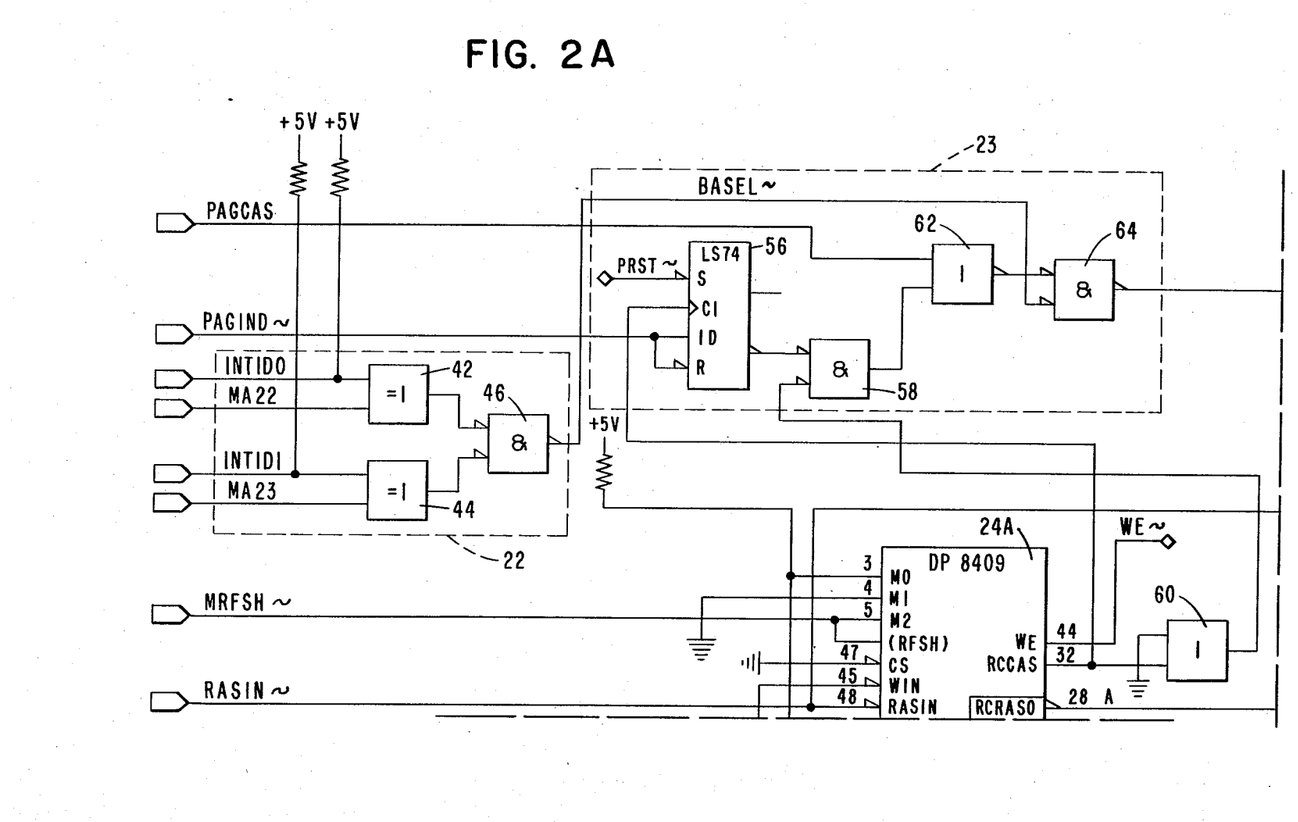
Figure 2B:
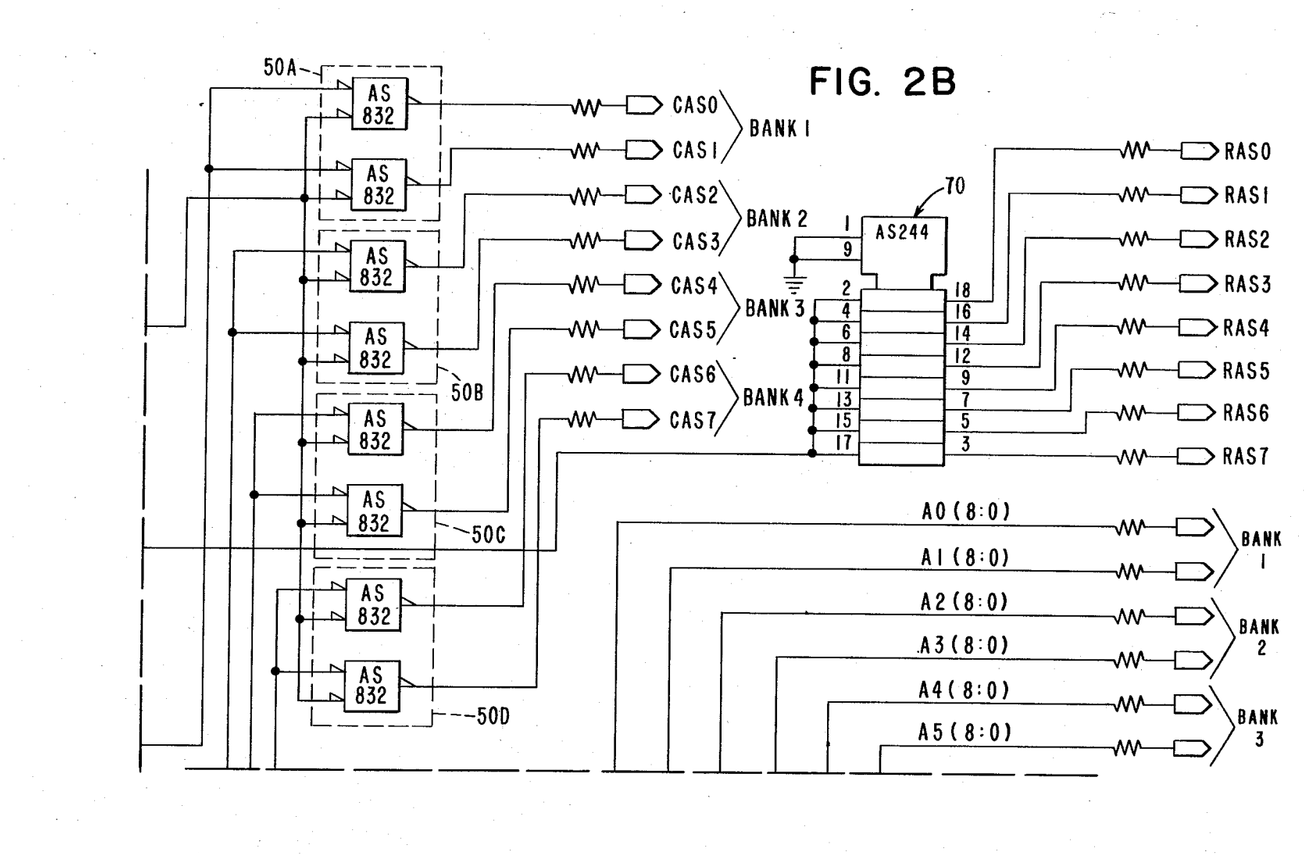
Figure 2C:
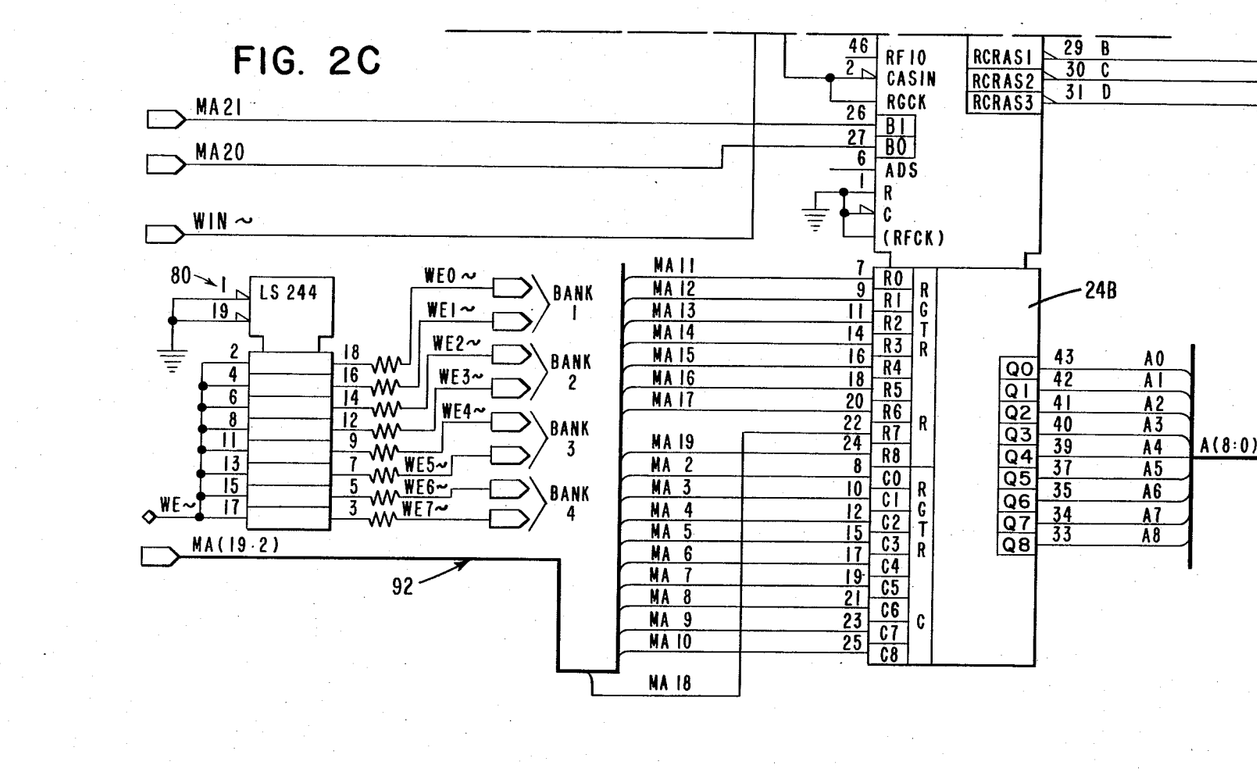
Figure 2D:
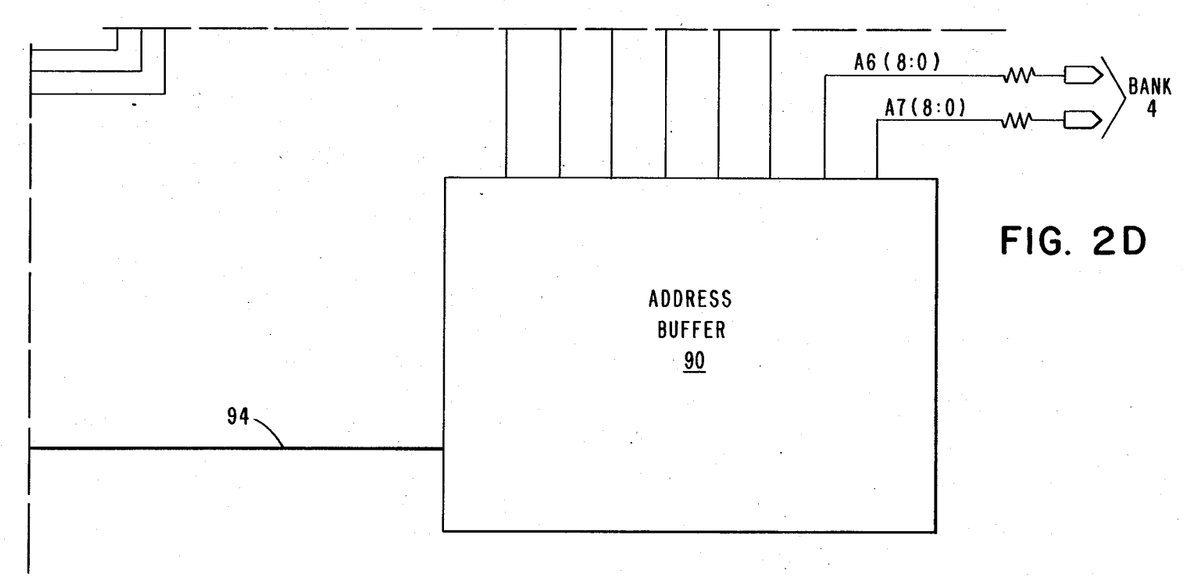

Referring now to FIGS. 2A-2D, arranged according to the map of FIG. 2, a bank selection logic circuit 24A is formed from the timing and selection portion of a Dynamic RAM controller 24 which in the preferred embodiment of the invention is a DP8409 chip manufactured by National Semiconductor Inc. A signal RASIN/ is connected to a like labeled input terminal of the bank selection circuit 24A. In response to the memory address bits MA20 and MA21 the bank selection logic provides an activation signal on one of the four outputs labeled A-D. The output lines A-D are coupled to the inputs of four banks of AND gates 50A-50D. Each bank of AND gates is comprised of two AND gates. In the preferred embodiment of the invention the AND gates were 74AS832 chips. Two AND gates are used in each bank of AND gates so as to provide adequate drive power to the memory elements 20. In the preferred embodiment of the invention 32 memory elements are used in each memory element bank 20. Each AND gate drives 16 memory elements in a bank. That is, the output from the first AND gate, in AND gate bank 50A, is labeled CAS0 and drives 16 memory elements in the memory element bank 20A (referring back to FIG. 1). The output of the second AND gate, in AND gate bank 50A, is labeled CAS1 and drives the remaining 16 memory elements in the memory element bank 20A. In a like manner the outputs labeled CAS2-CAS7 are grouped in pairs and are used to drive the memory elements in the banks 20B-20D. The memory elements within a bank are column strobed by having the associated pair of CAS signals going active low. In a like manner the outputs from buffer circuit 80, address buffer 90, and buffer circuit 70 are grouped into pairs and are applied to generally like labeled inputs of memory elements 20. The bank of AND gates 50 also receive as an input the signal PAGCAS via the output of the logical AND function circuit block 23. A signal RASIN/ is applied to all of the inputs of a buffer circuit 70. The buffer circuit 70 which may be a 74AS244 chip has all of its inputs connected together such that the state of a signal on its input will be reflected on all of the outputs. As previously stated, the outputs are grouped into pairs, again for the purpose of providing adequate drive power to the circuits being driven by these signals. The signal RASIN/ is also directed to a like labeled input of the bank selection logic circuit 24A.

The board selection logic 22 is comprised of an Exclusive OR gate 42 which receives as inputs the memory address bit MA22 and the signal INTID0. The output of OR gate 42 is coupled to an input of an AND gate 46. Also part of the board selection logic is the Exclusive OR gate 44 which receives as inputs the memory address bit MA23 and the signal INTID1. The output of OR gate 44 is coupled to an input of the AND gate 46. The output signal from AND gate 46 is the board select (enabling) signal BASEL/. The input lines labeled INTID0 and INTID1 are each connected thru resistors to a +5 voltage source and at the other end to the edge connectors of a circuit board. The purpose of these two lines is to establish the code that a board will respond to. This is accomplished by grounding either one or both or none of the board connector contacts in the edge connectors affixed to the system housing. Insertion of a board into the edge connector will automatically provide it with the correct board address. With two groundable conductors four hardwired code combinations are possible. When the memory address bits MA22-23 match the levels on a boards INTID0 and INTID1 lines the signal BASEL/ goes active low. The BASEL/ signal is applied as an input to the AND gate 64.

A flip flop 56 which may be a 74ALS74 chip receives on its R and 1D inputs the signal PAGIND/ and on its C1 input the signal RCCAS, from the like labeled output of the bank selection logic circuit 24A. The flip-flop 56 is set by a signal PRST/ that is applied to its S labeled input at the start of each page-mode operation. The output from flip-flop 56 is directed to an input of a NOR gate 58, which gate also receives as its other input the signal from the output of an OR gate 60. The NOR gate 58 gates to its output, a signal that is directed to an input of a NOR gate 62. The NOR gate 62 also receives as an input the signal PAGCAS. The output of NOR gate 62 is directed as an input to the AND gate 64 which gates the signal PAGCAS to its output under gating control of the signal BASEL/.

A buffer circuit 80 which may be a 74ALS244 chip receives as its sole input the signal write enable WE/. At its output the buffer circuit 80 provides the signals WE0/—WE7/ to respective banks of memory elements 20.

Memory address bits MA2-19 are applied over an address bus 92 to the address latch and multiplexing portion 24B of the Dynamic RAM Controller 24. Address bits MA11-19 are row bits and address bits MA-2-10 are column bits. These bits are row and column multiplexed to the output of the controller portion 24B as nine address bits A0-A8. The address bits A0-A8 are coupled to the address buffer 90 over an address bus 94. The address signals $A_0$-$A_7$ from the address buffer are applied to eight corresponding buses each of which is comprised of 9 conductors, 0-8. The first 16 memory elements are connected to one bus of a bank pair and the second group of 16 memory elements are connected to the other bus of a bank pair.

Figure 3:
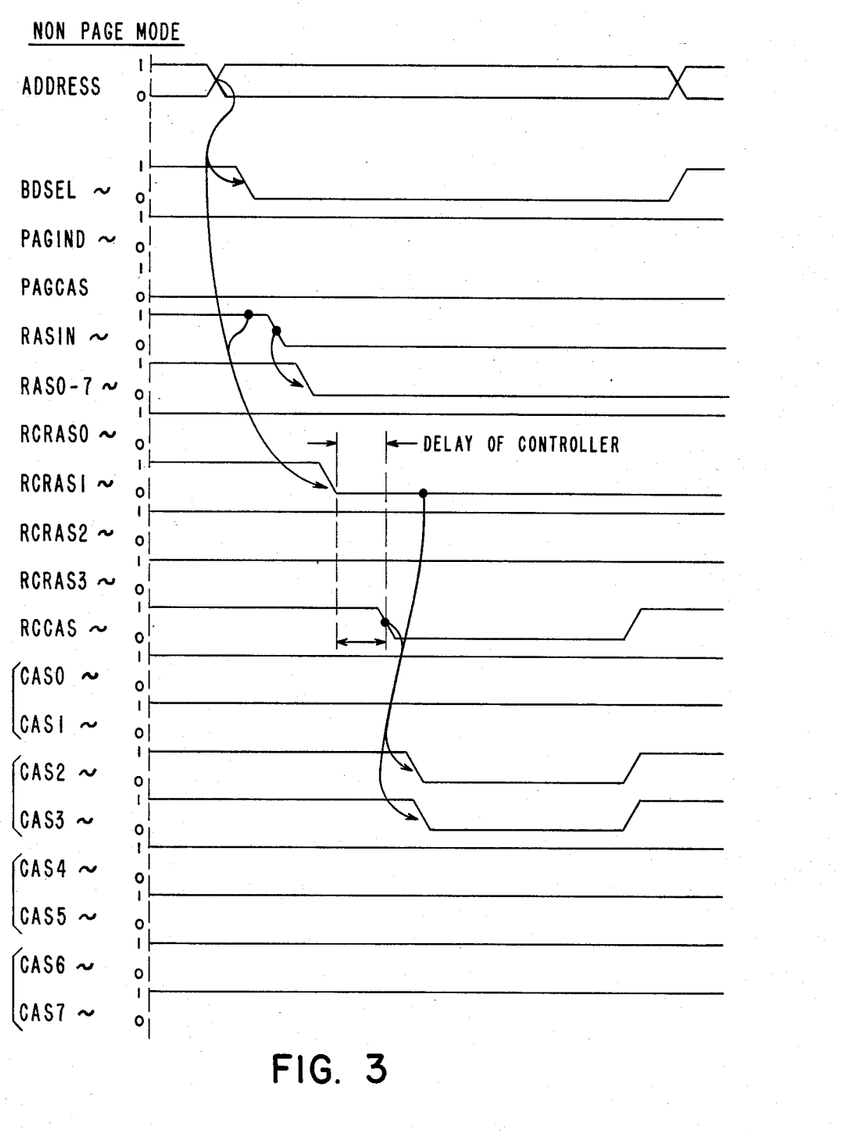
FIG. 3 is a group of waveforms illustrating memory operation in a non-page mode.

Referring now to FIG. 3 the ~ mark after a signal name indicates that the signal is active when low and is equivalent to a bar or a /. The ADDRESS signal, comprised of bits MA2-19, is applied to the board input terminals. The BDSEL/ signal follows a short time after the ADDRESS signal. The page indicator signal PAGIND/ is not active for the non-page operating mode, therefore it remains high. The PAGCAS is also inactive for this mode therefore it will remain low. A delay of approximately 10 ns after the address bits are stable the signal RASIN/ goes active to start the memory cycle. The RASIN/ signal causes the signals RAS-0-RAS7 to be applied to all the banks of memory elements on every board. At the output of the bank selection logic circuit portion 24A one of the signals RCRAS0-RCRAS3 is selected by the two memory address bits MA20-21. In the example shown in FIG. 3 the signal RCRAS1/ goes active.

The RCCAS output goes active a fixed delay time after any of the RCRAS0/-RCRAS3/ signals go active. The fixed delay time is inherent in the circuitry of the Dynamic RAM Controller 24. A short time later, for the example shown, the column signals CAS2/ and CAS3/ go active and the memory is addressed.

Figure 4:
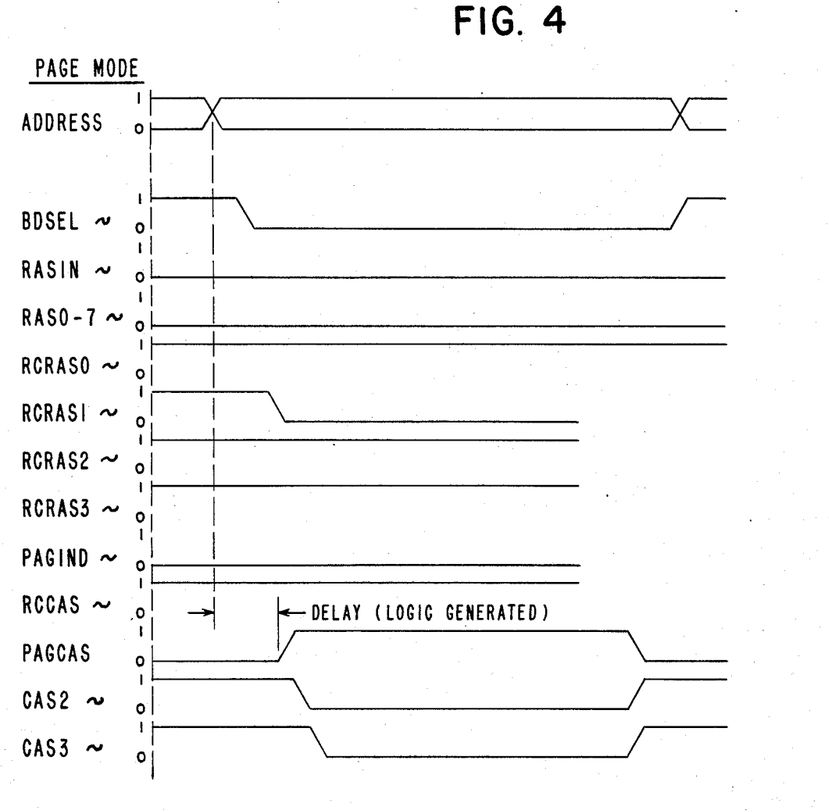
FIG. 4 is a group of waveforms illustrating memory operations in page-mode.

Referring now to FIG. 4 wherein the page-mode of operation is shown; once the row address bits MA11-19 are selected they remain constant until a different page is needed or until the non-page mode operation is entered. The same page of data is thus available for scanning by changing only the column addresses, and if desired, the bank and board select signals, to extend page-mode accessing to all the boards of the memory. In page-mode the signal PAGIND/ goes active low, and remains low as long as the memory is in page-mode operation also. The signal BDSEL/ goes active low, similar to the memory operation in non-page mode. The RASIN/ signal goes low and remains low throughout, as long as the row address does not change. The RASIN/ signal going low causes the signals RAS0-RAS7 to go low to select a memory bank (for the example shown, memory bank 2) by causing the signal RCRAS1/ to go active low. A short time later, the signal PAGCAS/ goes active high, which in turn activates the signals CAS2/ and CAS3/ to go active low. The first CAS signals strobe the column address into the memory elements. A second column address is then placed on the address bus and a second set of CAS signals go active low to strobe in the second column address. This process continues as long as there is interest in the particular page presently being addressed in the memory. Bank and board select signals can be changed while in page-mode to select from a much larger page than heretofore was possible. The flip-flop 56 ensures that when exiting the page-mode the PAGIND/ signal goes inactive high at the same time as the RASIN/ signal goes inactive high.

Although the invention has been described and illustrated in detail, it is to be understood that the same is by way of illustration and example only, and is not to be taken by way of limitation, the spirit and scope of the invention being limited only by the terms of the appended claims.

We claim:

1. A memory device comprising:
   a plurality of memory boards each comprising a plurality of memory banks, said memory banks comprising memory elements;
   each memory element addressably by one of a plurality of row addresses and one of a plurality of column addresses;
   means for simultaneously applying a row strobe signal to the memory elements of a plurality of said memory banks;
   means for applying one of said row addresses to the memory elements of each of said memory banks in response to said row strobe signal;
   a memory board selection means for providing a board enabling signal to a selected memory board; and
   a memory bank selection means for providing a column strobe signal to each memory of a selected memory bank on a board, when said board enabling signal is present, so as to enable the selected memory elements to receive one of said column addresses.

2. The memory device of claim 1 and further comprising:
   means for applying a write enable signal to the memory elements of each of said memory banks when a write operation is to be performed.

3. The memory device of claim 1 wherein said memory bank selection means includes a first logic circuit means having inputs for receiving memory address bits indicative of the memory bank to be selected, and having one output for each memory bank on a memory board, said first logic means decoding said address bits to determine the selected memory bank and to provide an enabling signal on the one output corresponding to the selected memory bank, and a second logic means for receiving the enabling signal from said first logic means and for passing the enabling signal from the one output to the selected memory elements.

4. A memory device comprising:

a plurality of memory boards each comprising a plurality of memory banks;

each of said memory banks comprising a plurality of memory elements addressable by one of a plurality of row addresses and one of a plurality of column addresses;

means for simultaneously applying a row strobe signal to the memory elements of a plurality of said memory banks;

means for applying one of said row addresses to the memory elements of each of said memory banks in response to said row strobe signal;

a plurality of memory board selection means each associated with one of the memory boards of said plurality of memory boards and responsive only to its particular memory board selection signal for providing an enabling signal when its associated memory board is selected;

a plurality of bank selection means each associated with one of the memory boards of said plurality of memory boards and responsive to a bank selection signal for providing an enabling signal on one of its outputs corresponding to the memory bank selected; and a plurality of logic means, one for each of said bank of columns of said memory banks, for receiving said enabling signal from said memory board selection means and connected to one of said output of a bank selection means for providing a column strobe signal to each memory element of a selected memory bank, on a selected board, so as to enable the selected memory elements to receive one of said column addresses.

5. A memory device comprising:

a plurality of memory boards each comprising a plurality of memory banks;

each of said memory banks comprising a plurality of memory elements, each addressable by one of a plurality of row addresses and one of a plurality of column addresses;

means for simultaneously applying a row strobe signal to the memory elements of a plurality of said memory banks;

means for applying row address information to memory elements of each of said memory banks in response to said row strobe signal;

a plurality of memory board selection means each associated with one of the memory boards of said plurality of memory board and responsive only to a selection signal intended for its associated memory board and for providing an enabling signal when its associated memory board is selected;

a plurality of bank selection means each associated with one of the memory boards of said plurality of memory boards and responsive to a bank selection signal for providing an enabling signal corresponding to the memory bank selected; and a plurality of logic means each associated with one of the memory boards of said plurality of memory boards for receiving said enabling signal from said memory board selection means and for receiving the enabling signal of said bank selection means for providing a column strobe signal to each memory element of a selected memory bank, on a selected board, so as to enable the memory elements of the selected memory bank to receive one of the said column addresses.

6. A memory device comprising:

a plurality of memory boards each comprising memory banks;

each of said memory banks comprising a plurality of memory elements, each addressable by one of a plurality of row addresses and one of a plurality of column addresses;

means for simultaneously applying a row strobe signal to the memory elements of a plurality of said memory banks;

means for applying row address information to the memory elements of each of said memory banks in response to said row strobe signal;

means for selecting a memory bank by applying a column strobe signal to the memory elements of the selected memory bank to enter memory addresses to the selected memory elements, said means continually providing column strobe signals as long as the memory device is in page-mode.

7. A method of page-mode operating a plurality of memory boards each comprising memory banks with each memory bank comprising a plurality of memory elements addressable by rows and column, said method comprising the steps of:

(a) applying a memory address signal having, row, column, board, and memory bank address bits to said plurality of memory boards;

(b) simultaneously applying an active row address strobe signal to the memory elements of a plurality of memory banks and maintaining said signal active during a page-mode operation;

(c) selecting a board and a memory bank in response to said memory address signal and applying a column address strobe signal to the selected memory bank;

(d) in response to said column address strobe signal, applying said memory address signal to the selected memory elements to address selected memory cells; and (e) repeating steps (c) and (d) for each column to be addressed while in page-mode.

* * * * *

UNITED STATES PATENT AND TRADEMARK OFFICE
CERTIFICATE OF CORRECTION

PATENT NO.  : 4,823,324

DATED       : April 18, 1989

INVENTOR(S) : Billy K. Taylor et al.

It is certified that error appears in the above-identified patent and that said Letters Patent is hereby corrected as shown below:

Column 6, line 55, after the word "memory", insert --element--.

Signed and Sealed this

Twenty-first Day of November, 1989

*Attest:*

JEFFREY M. SAMUELS

*Attesting Officer*     Acting Commissioner of Patents and Trademarks